United States Patent [19]

Modlin et al.

[11] Patent Number: 5,363,048
[45] Date of Patent: Nov. 8, 1994

[54] METHOD AND SYSTEM FOR ENSURING INTERCONNECT INTEGRITY IN A MICRO-CHIP-MODULE

[75] Inventors: Douglas Modlin, Palo Alto, Calif.; Joel Parke, Marlborough, Mass.; Deng-Yuan Fu, Sunnyvale, Calif.

[73] Assignee: Digital Equipment Corporation, Maynard, Mass.

[21] Appl. No.: 977,531

[22] Filed: Nov. 17, 1992

[51] Int. Cl.$^5$ ............................................. G01R 31/08
[52] U.S. Cl. ................................. 324/519; 324/537; 324/679; 324/73.1
[58] Field of Search ............... 324/660, 679, 519, 537, 324/73.1

[56] References Cited

U.S. PATENT DOCUMENTS

| | | | |
|---|---|---|---|
| 3,975,680 | 8/1976 | Webb | 324/686 |
| 4,565,966 | 1/1986 | Burr et al. | 324/519 |
| 5,138,266 | 8/1992 | Stearns | 324/537 |
| 5,187,430 | 2/1993 | Marek et al. | 324/66 |

*Primary Examiner*—Kenneth A. Wieder
*Assistant Examiner*—Glenn W. Brown
*Attorney, Agent, or Firm*—Flehr, Hohbach, Test, Albritton & Herbert

[57] ABSTRACT

The integrity of the interconnects in a predefined micro-chip-module are tested in two phases. Before any integrated circuit chips are loaded onto the micro-chip-module, the capacitance value of each interconnect is measured and the measured capacitance value is compared with a predetermined range of acceptable values to establish if an interconnect error exists. The measurement and comparison process is repeated after a predefined set of integrated circuit chips are loaded onto the micro-chip-module. The capacitance of each interconnect node is indicative of the total length of the interconnect traces of the node, and thus a short circuit will result in a capacitance measurement above the predetermined range for the node, and an open circuit will result in a capacitance measurement below the predetermined range for the node. In addition, the relationships between the capacitances of the nodes before and after loading the chips on the micro-chip-module can be represented by a set of equations, and those equations can be used to define the range of acceptable capacitance values for each node of the loaded micro-chip-module as a function of the capacitances of the input/outputs of the chips loaded onto the micro-chip-module.

15 Claims, 5 Drawing Sheets

| Pad ID | Node ID | Pad Position | Min Unloaded Value | Max Unloaded Value | Measured Unloaded Value | Min Loaded Value | ••• |
|---|---|---|---|---|---|---|---|
| | | | | | | | |

METHOD AND SYSTEM FOR ENSURING INTERCONNECT INTEGRITY IN A MICRO-CHIP-MODULE

The present invention relates generally to verifying the integrity of the metal interconnects in a micro-chip-module. In particular, it pertains to methods and systems for detecting whether an interconnect has an open or short circuit.

BACKGROUND OF THE INVENTION

A micro-chip-module is an assembly of receptacles for receiving predefined integrated circuit chips. The receptacles are located on a high density signal carrier (HDSC) or other type of micro-chip-module substrate. When the integrated circuit chips are loaded into the receptacles, the input/output pins of each chip are interconnected with the input/output pins of other ones of the chips, as well as with input/output connectors for the micro-chip-module, by a series of metal interconnects located on the high density signal carrier. The metal interconnects connect the pins of the loaded chips in such a way as to make the micro-chip-module suitable as a discrete component in a particular electronic system, typically a computer or other data processing system. For example, Digital Equipment Corporation's 3MAX++ micro-chip-module is used as the central processing unit (CPU) in a number of computer systems.

However, during fabrication of the micro-chip-module, errors in the construction of the interconnects may occur. In order to ensure that a particular micro-chip-module will perform properly, it must be verified that each interconnect does not have an open or short circuit.

In the past, there have been several attempts at developing a method for doing so. These include the boundary scan method and the resistance measurement method, both of which are well known to those skilled in the art.

The boundary scan method involves generating a patterned input signal at an input port of the micro-chip-module. The signal is then passed in series through each interconnect so that the input signal traverses all the interconnects on the micro-chip-module. The patterned input signal is passed from interconnect to interconnect by circuitry which is added to each integrated circuit chip specifically for this purpose. The patterned signal is finally observed at an output port of the micro-chip-module to determine if there are any open or short circuits in the series of interconnects.

As suggested above, one problem with this method is that it requires the integrated circuit chips to be manufactured with additional circuitry. In some cases, this additional circuitry takes up approximately 10% of the entire chip area. Another problem associated with this method is that it cannot be determined which interconnect is faulty. Since the signal is passed in series through each interconnect and only detected at the output port, if the output signal pattern differs from what would be output by a properly functioning micro-chip-module, it cannot be determined which interconnect has an open or short circuit.

The resistance measurement method on the other hand involves the use of an apparatus with multiple probes to measure simultaneously the resistance of multiple interconnects. From the observed resistance measurements, it can be determined which interconnects have an open or short circuit. However, there is a significant problem with this method. Complex micro-chip-modules require a large number of interconnects. As a result, a large number of probes must be used in the apparatus described above. However, it is often impractical to make test apparatus with the required number of probes, and sequential probing of subsets of the interconnections using a smaller number of probes is also not practical because it is slow and because it may also fail to find short circuits.

Since each micro-chip-module may be worth hundreds or thousands of dollars, it would be very beneficial to have a test methodology that not only provides a pass/fail indication for each micro-chip-module, but also provides a specific indication of each failed node and the nature of the failure. For instance, if the test methodology were able to identify the interconnection failure specifically, such as with a message that "interconnect node X has an open circuit," that would greatly facilitate the process of deciding which micro-chip-modules can be repaired as well as the process of repairing the micro-chip-modules with repairable faults.

Therefore, there is a need for a method and system for ensuring interconnect integrity in a micro-chip-module which (1) does not unnecessarily add area to the integrated circuit chips of the micro-chip-module, (2) pinpoints which interconnects are faulty, (3) is practical to implement, and (4) tests for all possible open and short circuits.

SUMMARY OF THE INVENTION

In the context of the present invention, a micro-chip-module is defined as a substrate that includes at least one receptacle for receiving predefined integrated circuit chips and a multiplicity of interconnects. Each predefined integrated circuit chip has a multiplicity of input/output pins and these pins are classified by pin type, where all pins of each pin type are known to have approximately the same capacitance with respect to a reference plane of the micro-chip-module. Each interconnect comprises a distinct node having at least one pad at which the node can be probed. In addition, each interconnect is connected to at least one corresponding pin when the micro-chip-module is loaded with the *predefined integrated circuit chips.

The present invention tests the integrity of the interconnects in a predefined micro-chip-module as follows. First, before any integrated circuit chips are loaded onto the micro-chip-module, the capacitance value of each interconnect is measured and then the measured capacitance value is compared with a predetermined range of acceptable values to establish if an interconnect error exists. The measurement and comparison process is repeated after a predefined set of integrated circuit chips are loaded onto the micro-chip-module.

The apparatus of the present invention includes a computer. The computer's memory is used to store, for each node of the micro-chip-module, at least one corresponding pad position and a corresponding maximum and minimum capacitance value for when the micro-chip-module is not loaded with the predefined integrated circuit chips. A test program running in the computer then directs a probe apparatus to contact each node at the corresponding stored pad positions while the micro-chip-module is not loaded. For each node contacted by the probe apparatus while the micro-chip-module is not loaded, a capacitance measurement apparatus measures a corresponding capacitance value. The measured capacitance value for each node is then received by an input port of the computer and then stored by the computer memory. The test program compares the measured capacitance value for each node with the corresponding stored maximum and minimum capacitance values. If for any node the stored corresponding measured capacitance value does not fall within the stored corresponding maximum and minimum capacitance values, the test program generates a report or other signal indicating an interconnect error at that node.

BRIEF DESCRIPTION OF THE DRAWINGS

The foregoing and other objects of the invention will be more clearly understood from the following detailed description and appended claims when read in connection with the following drawings, in which:

DESCRIPTION OF THE PREFERRED EMBODIMENT

Figure 1:
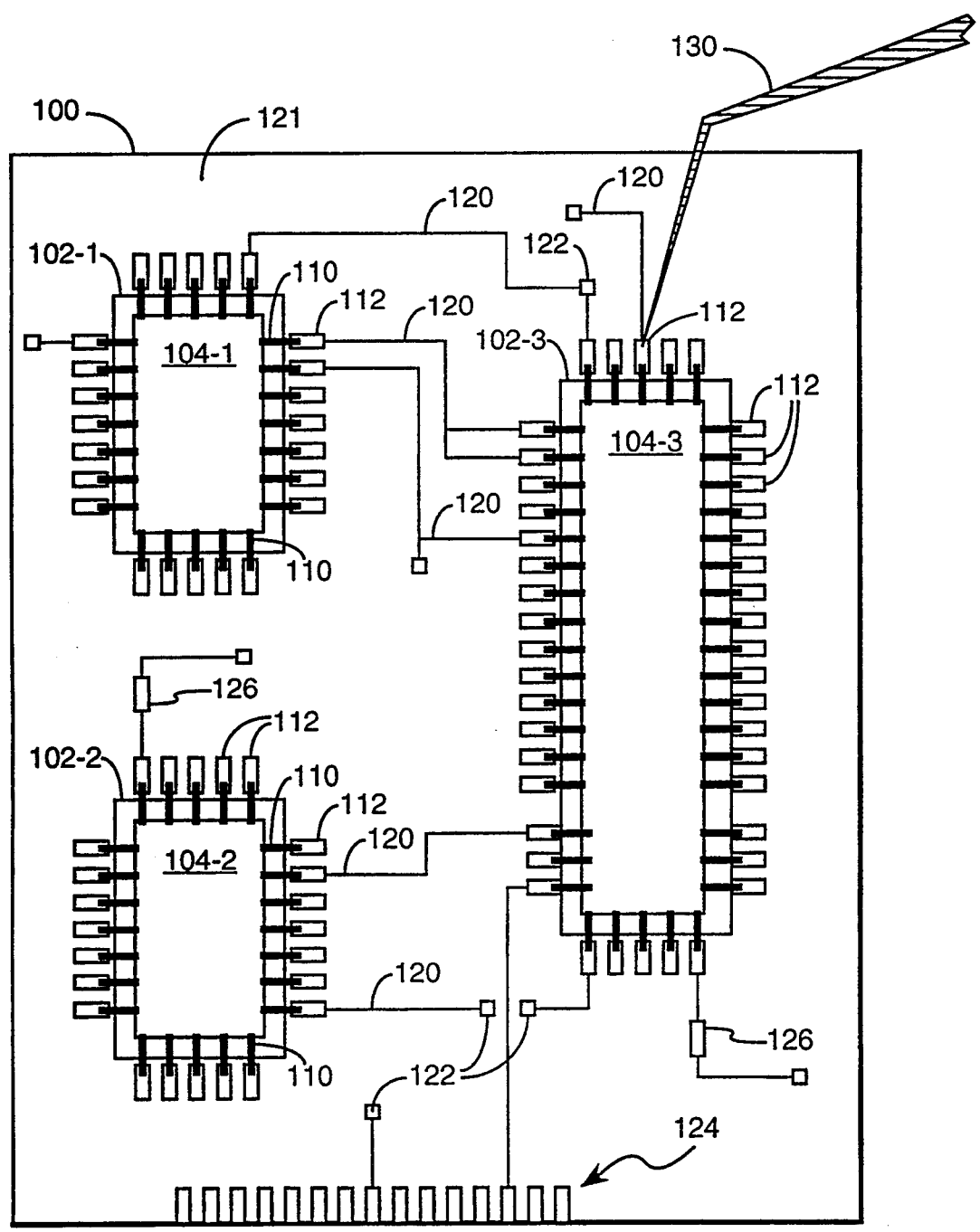
FIG. 1 shows a micro-chip-module loaded with integrated circuit chips being contacted by a probe.

FIG. 1 represents a micro-chip-module 100 having a set of receptacles 102-1, 102-2, 102-3 in which are loaded a set of predefined integrated circuit chips 104-1, 104-2, 104-3. Each predefined chip 102 has a number of input/output pins 110. The chips 104 are surface mounted onto the micro-chip-module 100 so that each pin is electrically connected to a corresponding connection pad 112 on the micro-chip-module. Every pad 112 is coupled to various ones of the metal trace interconnects 120 on the micro-chip-module. For the purposes of describing the present invention, FIGS. 1 and 2 only show a small subset of the interconnects that would be found in an actual micro-chip-module.

As is standard, the micro-chip-module 100 is a substrate 121 supporting two or more layers of metal trace interconnects, only one of which is shown in the Figures, and one or more reference planes (e.g., held at a common ground or other power supply potential). Vias 122, filled with metal, couple the interconnect traces on each layer to various ones of the interconnect traces on other layers. Also, some of the interconnection traces are used to connect ones of the pins 110 to module input/output pads 124 located along the periphery of the micro-chip-module 100. For the purposes of this document, all the individual metal traces that are interconnected by vias to form one electrical common node are herein referred to as a "node" or "an interconnect", and the terms "interconnect" and "node" will be used interchangeably.

It is noted that the interconnects may have additional pads 126, located at positions other than the periphery of the receptacles 102. For instance, such additional pads 126 could be provided at vias and/or for the purpose of allowing the interconnects to be probed at positions other than their endpoints. A probe pin 130 is shown touching a pad 112 of one interconnect node 120.

Figure 2:
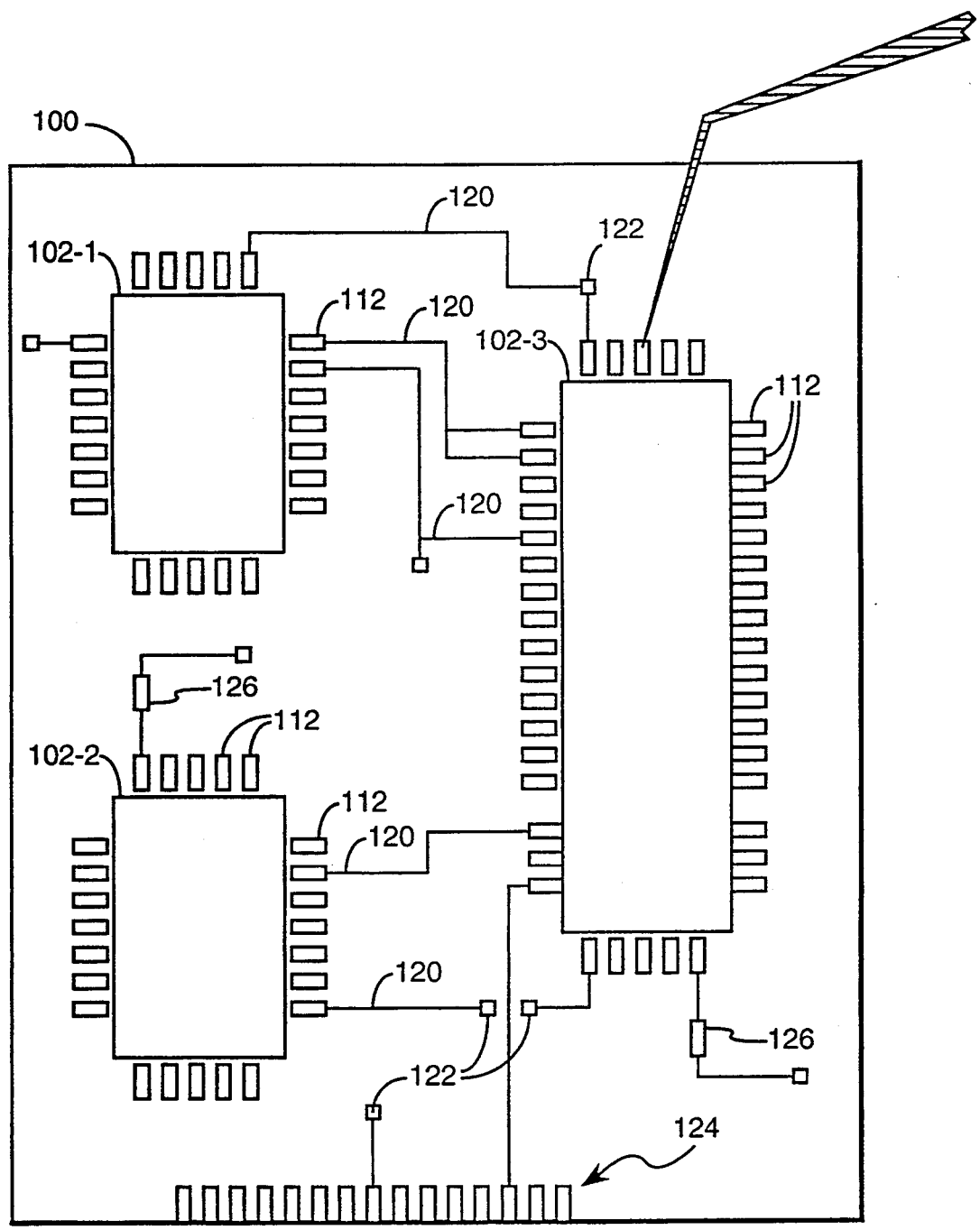
FIG. 2 shows an unloaded micro-chip-module being contacted by a probe.

The method and apparatus described herein initially require that micro-chip-module 100 not be loaded with the predefined chips 104. An unloaded micro-chip-module 100 is shown in FIG. 2.

Figure 3:
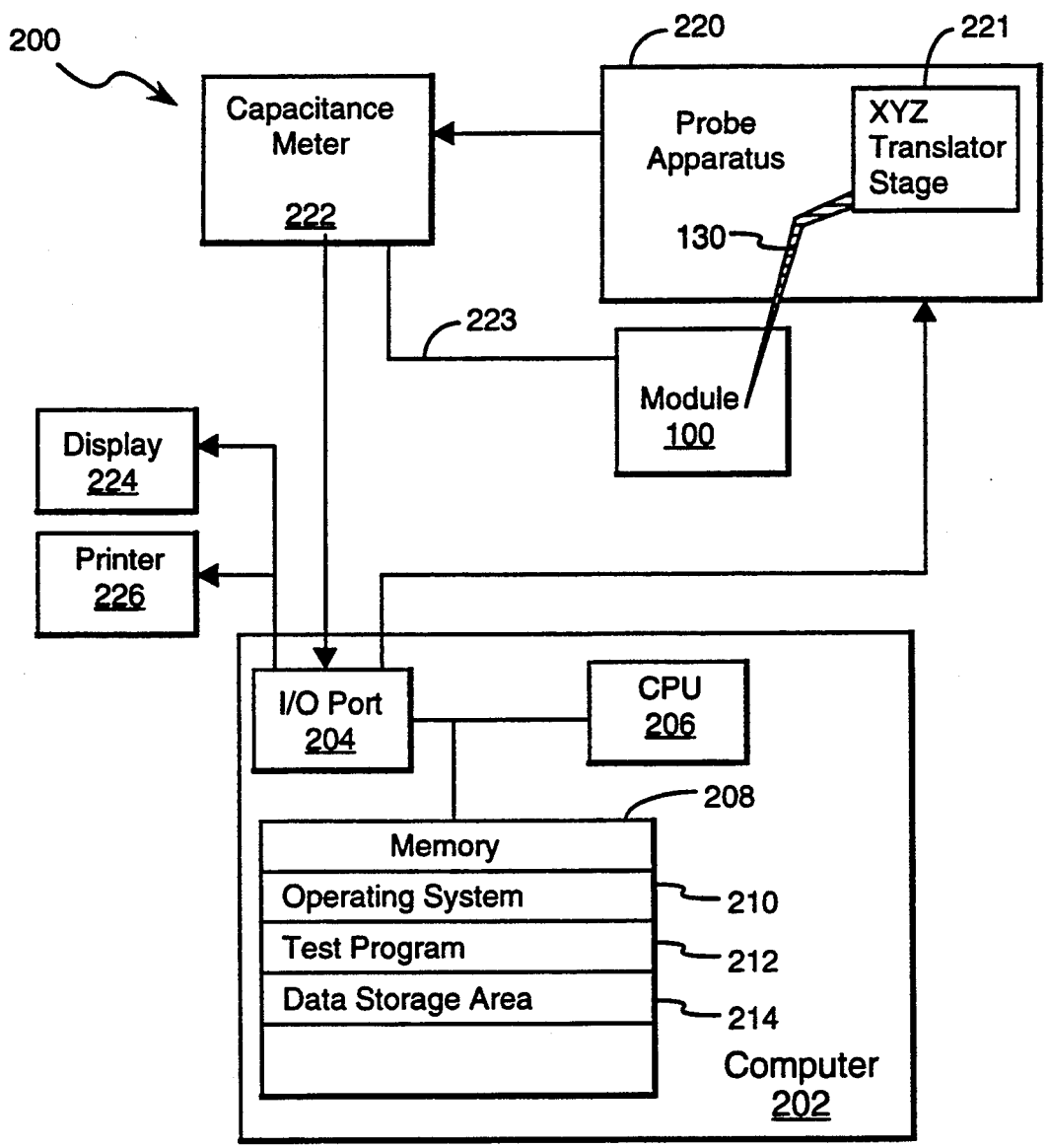
FIG. 3 is a block diagram of system for testing interconnect integrity in micro-chip-module.

FIG. 3 shows a system 200 for testing the integrity of the interconnects in a micro-chip-module. The system's controller is a computer 202 having an input/output port 204, a central processing unit 206, and a computer memory 208 which contains an operating system 210, a test program 212, and a data storage area 214. Probe apparatus 220 is used to contact a pad 112 on each node 120 of the micro-chip-module 100 under test at the direction of the computer's test program 212. Typically, the probe apparatus 220 will include an XYZ translator stage 221 for moving probe pin 130 to a sequence of specified positions on the micro-chip-module 100. A capacitance meter 222, or other capacitance measurement apparatus, measures a corresponding capacitance value for each node 120 contacted by probe apparatus 220. A ground return line 223 couples the common ground node of the capacitance meter 222 to the conductive chuck on which the micro-chip-module mounted and thus is also coupled to one of the reference planes of the micro-chip-module, thereby providing a common a.c. ground for both the capacitance meter 222 and the micro-chip-module under test.

The capacitance meter 222 sends the measured capacitance value to the computer 202 for storage and analysis. The results of the interconnect integrity tests performed by the system 200 are typically conveyed from the computer 202 to an operator or supervisory engineer via a computer display device 224 or printer 226. A file representing the tests performed and capacitance measurements for each micro-chip-module tested are also typically stored on a computer disk (not shown).

TESTING PROCEDURE: DETERMINING MIN/MAX RANGES

Figures 4, 5:
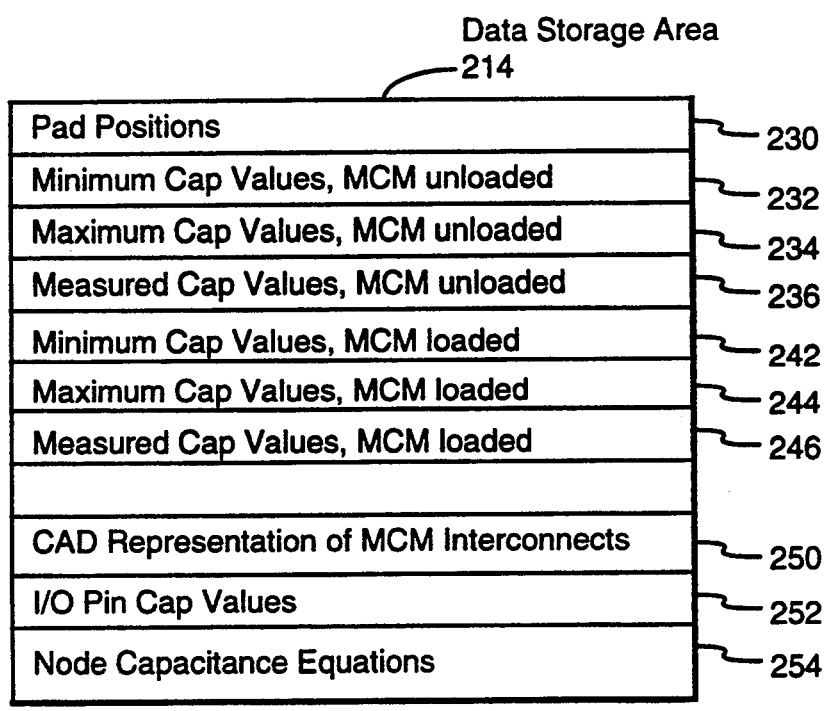
FIG. 4 shows a memory map of various values stored in the computer memory of the system shown in FIG. 3.
FIG. 5 represents a table of the values stored in the computer memory during operation of the preferred embodiment of the invention.
Figure 7:
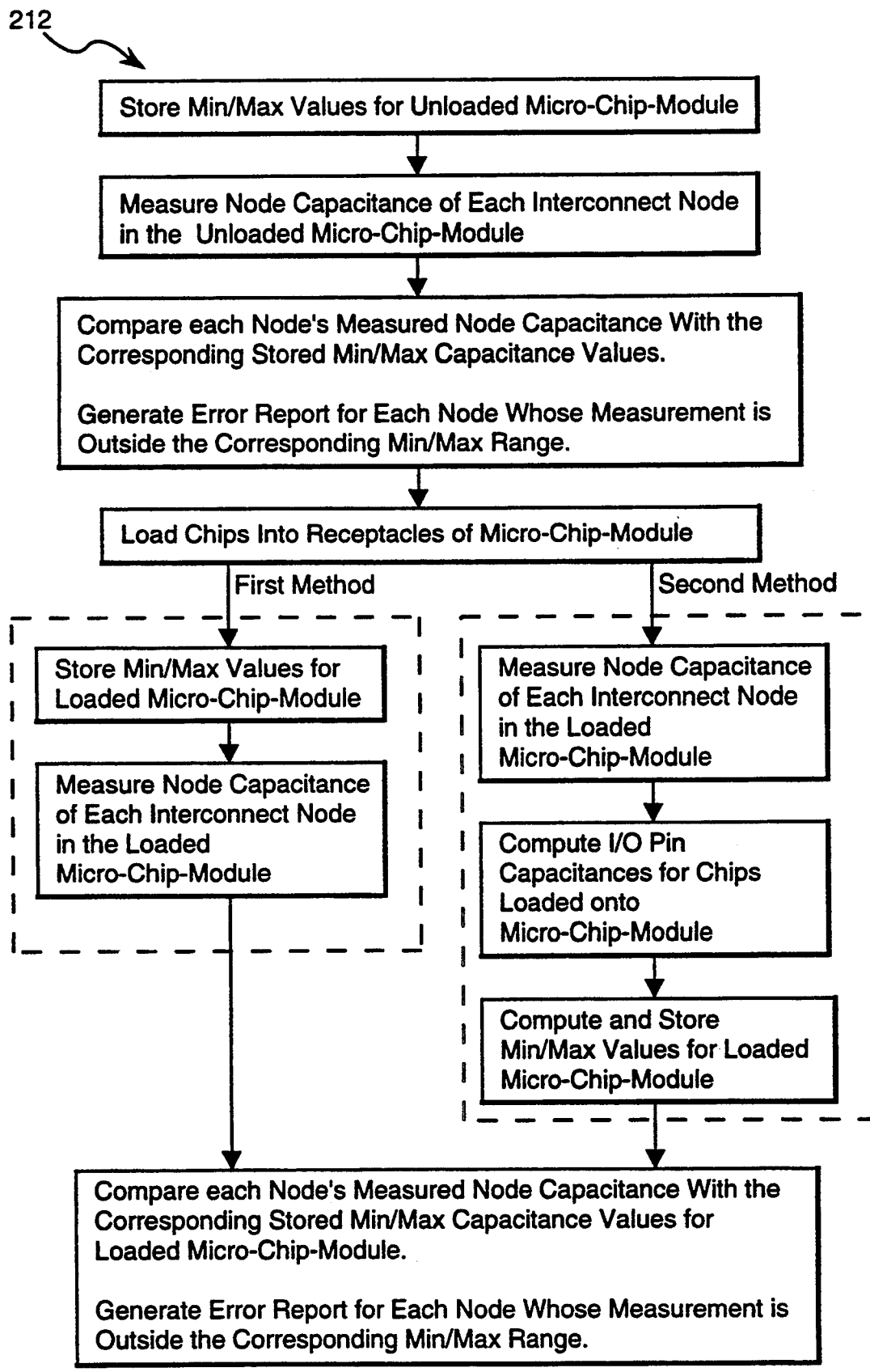
FIG. 7 is a flow chad representing the interconnect integrity testing procedures used in the preferred embodiments of the invention.

Referring to FIG. 4, prior to performing any tests on a particular instance of a micro-chip-module, the computer memory 208 is loaded with the following data:

a vector of pad positions 230, including at least one pad position for each node 120;

a vector of minimum capacitance values 232, including a minimum capacitance value for each node when the micro-chip-module is unloaded;

a vector of maximum capacitance values 234, including a maximum capacitance value for each node when the micro-chip-module is unloaded;

a blank or cleared vector 236 for receiving measured capacitance values when the micro-chip-module is unloaded;

a vector of minimum capacitance values 242, including a minimum capacitance value for each node when the micro-chip-module is loaded;

a vector of maximum capacitance values 244, including a maximum capacitance value for each node when the micro-chip-module is loaded; and a blank or cleared vector 246 for receiving measured capacitance values when the micro-chip-module is loaded.

FIG. 5 illustrates how the vectors 230–246 stored in computer memory 208 may be arranged in a single table 248 in data storage area 214. However, these values could also be arranged in separate tables or files.

The stored minimum and maximum capacitance values 232 and 234 define an acceptable range of capacitances for each node 120 when the micro-chip-module 100 is not loaded with the predefined chips 200. In some cases the generated maximum and minimum capacitance values for one pad 112 of a node 120 may vary slightly from the maximum and minimum capacitance values for a different pad 112 of the same node 120. This is due to the fact that the interconnect traces, and the vias between different interconnect traces, of a particular node 120 may be sufficiently resistive to mask a portion of the capacitance that is physically distant from the pad being probed. Measurements on many micro-chip-modules have shown that this resistance type masking of the capacitance of a node can reduce a node's measured capacitance by as much as one percent in some cases. Thus, slightly different capacitances may be measured at different pads of the same node. While the capacitance masking affect is usually small, it is important to take this into account for accurate testing of the micro-chip-modules when setting the minimum and maximum capacitance values for each node 120. For this reason, in the preferred embodiment, minimum and maximum capacitance values are defined for each pad 112 to be probed, rather than for each node 120. However, if only one pad were to be probed for each node, then there would only be one rain/max range for each node when unloaded and one rain/max range for each node when loaded.

There are at least two methods for generating the minimum and maximum value vectors 232, 234, 242 and 244. A first method is to measure the node capacitances of many micro-chip-modules before loading the micro-chip-modules with chips, and also after loading the micro-chip-modules with chips, and storing the measured values. Then, the loaded micro-chip-modules are thoroughly tested using conventional functional test techniques. Next, using the stored measurement data only for the micro-chip-modules that passed all tests, average, minimum and maximum values are computed. Typically, the measured capacitance values for working micro-chip-modules will vary very little, typically by less than two or three percent, and thus the minimum and maximum values will typically be set at values such as the average measured value, plus or minus 2.5 percent. This technique is suitable for generating minimum and maximum capacitance value for both the unloaded micro-chip-module and the loaded micro-chip-module.

A second method of generating the minimum and maximum value vectors is to derive these values from data 250 representing the interconnect patterns. For instance, the data in a computer aided design system representing the interconnection patterns can be used to determine the total length of each interconnect, or the total substrate area covered by each node. The computed length or area value is then multiplied by an appropriate "capacitance per length" or "capacitance per area" factor to generate an expected capacitance value for each node. The minimum and maximum capacitance values for the unloaded micro-chip-module are then computed by multiplying the expected capacitance values by appropriate scaling factors, such as 0,975 and 1.025, respectively.

To compute minimum and maximum capacitance values for the micro-chip-module when loaded, all the I/O pins of the chips to be loaded into the micro-chip-module are classified by type, where each type of I/O pin has a known capacitance, stored as vector 252 of I/O pin values in the data storage area 214. These different pin types may be classified as, for example, address pins, input pins, output pins, input control signal pins, ground pins, Vcc pins, and so on. More generally, the I/O pins can be classified as types I to Y, having capacitances of CP1 to CPY, and the number of I/O pins of each type connected to node i can be represented by integer values $N1_i, N2_i, \ldots, NY_i$. In general, there will be many less I/O pin types than there are I/O pins in the micro-chip-module. A typical micro-chip-module with, say, 200 I/O pins will have approximately fifteen to thirty I/O pin types. The capacitance of each node is represented as follows:

$$CL_i = CU_i + N1_i CP1 + N2_i CP2 + \ldots + NY_i CPY \quad \text{(Eq. 1)}$$

where i represents the node, $CL_i$ is the capacitance of node i when the micro-chip-module is loaded, $CU_i$ is the capacitance of node i when the micro-chip-module is unloaded, $Nx_i$ is the number of I/O pins of type x connected to node i, and $CP_j$ is the capacitance of each I/O pin of type j.

The node capacitance equations for all the nodes of the micro-chip-module, or equivalently the vector of coefficients for each node, are stored in an array 254 in the data storage area. The array 254 of coefficients has X rows and Y columns, and effectively represents the following matrix equation:

$$\begin{pmatrix} CL_1 \\ CL_2 \\ \cdot \\ \cdot \\ \cdot \\ CL_X \end{pmatrix} = \begin{pmatrix} CU_1 \\ CU_2 \\ \cdot \\ \cdot \\ \cdot \\ CU_X \end{pmatrix} + \begin{pmatrix} N1_1 & N2_1 & \ldots & NY_1 \\ N1_2 & N2_2 & \ldots & NY_2 \\ \cdot & \cdot & & \cdot \\ \cdot & \cdot & & \cdot \\ \cdot & \cdot & & \cdot \\ N1_X & N2_X & \ldots & NY_X \end{pmatrix} \begin{pmatrix} CP1 \\ CP2 \\ \cdot \\ \cdot \\ \cdot \\ CPY \end{pmatrix}$$

which can be represented more compactly as:

$$CL = CU + N\, CP \quad \text{(Eq. 2)}$$

where CL is the vector of loaded capacitance values, CU is the vector of unloaded capacitance values, N is the array of I/O pin type coefficients, and CP is a vector of the I/O pin type capacitance values. Thus the equation for each node (or pad) defines a capacitance value at a respective node 120 (or pad 112) for when micro-chip-module 100 is loaded with the predefined chips 200. Each equation expresses this capacitance value as the sum of (A) a capacitance value for the respective node 120 (or pad I 12) for when micro-chip-module 100 is not loaded and (B) a weighted sum of capacitance values for the I/O pins connected to the respective node 120.

Using the above matrix of equations, the expected capacitance of each node when the micro-chip-module is loaded can be computed from the expected unloaded capacitance values and the expected I/O pin capacitance values. The minimum and maximum capacitance values for the loaded micro-chip-module are then computed by multiplying the expected capacitance values by appropriate scaling factors, such as 0.975 and 1.025, respectively.

Figure 6:
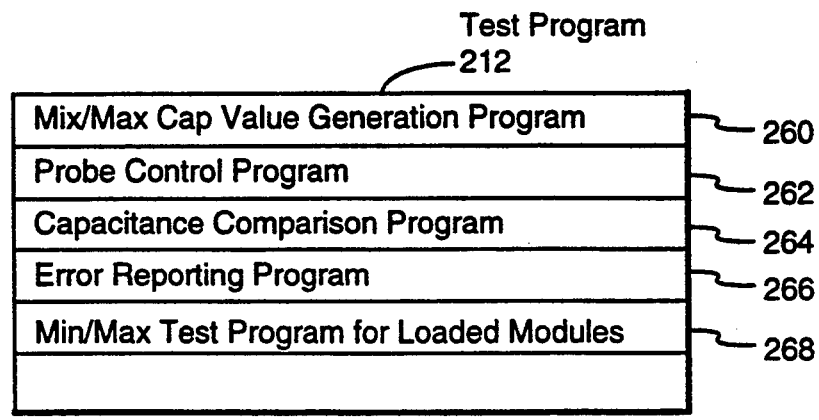
FIG. 6 is a block diagram representing the various subprograms of the test program used in the preferred embodiment of the invention.

The program which generates the minimum and maximum capacitance values in accordance with the above described second method is represented in FIG. 6 as program 260.

TESTING PROCEDURE: UNLOADED MICRO-CHIP-MODULE TEST

Referring to FIGS. 3, 4, 6 and 7, test program 212 controls the process of testing a micro-chip-module before and after chips are loaded onto the micro-chip-module. The test program 212 includes a number of subprograms, including a probe control program 262 that directs probe apparatus 220 to contact at least one pad 112 of each node 120 at its corresponding pad position (stored in array 230). Capacitance meter 222 continuously measures the capacitance of whatever node is currently being contacted by the probe 130 and transmits the current measurement value to the computer via the input/output port 204. After the probe 130 contacts each specified pad, the probe control program 262 reads the capacitance value produced by the meter 222 and stores the received capacitance value in array 236 of data storage area 214. The first series of probe contacts and capacitance measurements are performed while micro-chip-module 100 is not loaded with the predefined chips 104, as shown in FIG. 2.

Either after each measurement is stored in array 236, or after all the measurement values have been stored, a capacitance value comparison program (or subroutine) 264 compares for each node 120 (or for each pad I 12) for which a measurement was taken, the stored measured capacitance value with its corresponding maximum and minimum capacitance values. If for any pad or node the corresponding measured capacitance value does not fall within the corresponding maximum and minimum capacitance values, then an error reporting program 266 of test program 212 generates a report or other signal indicating that an interconnect error exists at that particular pad or node. In the preferred embodiment, when the out-of-range measured capacitance exceeds the corresponding maximum value, the report or signal generated by program 266 indicates that a short circuit exists. When the out-of-range measured capacitance is less than the corresponding minimum value, the report indicates that an open circuit exists. These error reports are typically displayed on the computer's display device 224 or printed on its printer 226, listing all the out-of-range nodes of the micro-chip-module under test.

TESTING PROCEDURE: LOADED MICRO-CHIP-MODULE TEST

After the above described contacts, measurements, and comparisons have taken place, micro-chip-module 100 is then loaded with predefined integrated circuit chips 104. FIG. 1 shows micro-chip-module 100 loaded with predefined chips 104.

The probe control program 262 is run a second time to measure the capacitance of the micro-chip-module interconnects at the same set of pads that were probed when the micro-chip-module was unloaded. In one preferred embodiment, the minimum and maximum capacitance values for the loaded micro-chip-module 100 are defined in advance (based on capacitance measurements of loaded micro-chip-modules that passed functional tests, as described above), and stored in vectors 242 and 244, respectively. In that embodiment the measured capacitance values are compared with the rain/max range for each corresponding node 120 or pad 112 by comparison program 264, and any out-of-range nodes or pads are reported by the error reporting program 266.

In a second embodiment, the capacitance associated with each of the I/O pins of the predefined chips 104 loaded into the micro-chip-module 100 are not known in advance, and thus the minimum and maximum capacitance values for the loaded micro-chip-module 100 are not defined in advance. In this case, another program 268 is used to solve the set of node equations shown above as matrix equation 2. In particular, the values for the CL and CU vectors are known from the measurements of the micro-chip-module 100 node capacitances before and after loading of the chips onto the micro-chip-module 100. Further, the number of each type of I/O pin on each node is known, and thus all the $N1_i$ to $NY_i$ coefficient values are known. By solving the predefined equations represented by matrix equation 2, the program 268 generates a set of computed capacitance values CP1 to CPY for the Y different I/O pin types. The computed capacitance values CP1 to CPY are stored as vector 252 of I/O pin values in the data storage area 214.

In the preferred embodiment, the matrix equation is solved using the technique known as singular value decomposition. Note that the number of equations typically exceeds the number of variables (CP1 to CPY) by a factor of five or more, and thus the set of equations is over determined. Singular value decomposition generates a set of values with minimized average error. This is important because if the micro-chip-module 100 under test has one or more short circuits or open circuits, the matrix equation 2 will not be a true representation of the micro-chip-module 100 under test, and thus it is important that each equation only have a limited impact on the value computed for each variable.

Once the matrix equation 2 has been solved to generate a set of computed I/O pin capacitance values, the rain/max test program 268 for loaded micro-chip-modules next treats the loaded capacitance values $CL_i$ in matrix equation 2 as unknown quantities, and the I/O pin capacitance values CP1 to CPY as known quantities, and then uses matrix equation 2 to compute target capacitance values for each node (or pad). The computed target $CL_i$ values are then multiplied by appropriate scaling factors, such as 0.975 and 1.025, to generate the minimum and maximum capacitance values for the loaded micro-chip-module, which are then stored in vectors 242 and 244.

Once the minimum and maximum loaded value vectors 242 and 244 have been generated, the capacitance comparison program 264 and error reporting program 266 are run, as described above, to test for and report on any out-of-range nodes.

An advantage of the second preferred method of testing the capacitance values for loaded micro-chip-modules is that the any variation in the I/O pin capacitances is automatically compensated by the testing process.

A disadvantage of the second preferred method is that the interconnects for ground potential and power supply voltages may not be adequately tested. The reason for this is that each ground and power supply voltage pin 112 for each chip 104 will have a capacitance value unique to that type of chip. Even if the microchip-module under test includes a large number of the same type of chip, the number of equations in matrix equation 2 with non-zero coefficients for the ground and power supply voltage pins will be less than the number of such pin types. Thus there will be an insufficient number of equations to solve for the power and ground pin capacitance values. To avoid this problem, the minimum and maximum capacitance values of the power and ground nodes, when the module is loaded with chips, must be defined in advance. For instance, the power and ground capacitance ranges could be based on measurements of micro-chip-modules known to work properly. All other interconnect nodes can be processed using the matrix of equations as described above.

It is noted that since the only loaded micro-chip-modules to be tested are micro-chip-modules that passed all tests when the micro-chip-modules were unloaded, the primary failure mechanism during the second pass will be I/O pins not connected to their corresponding interconnections, detected by capacitance measurements below their respective minimum values. A second, less common failure mechanism during the second pass will be short circuits between interconnects caused by the process of loading and connecting the chips to the micro-chip-module, and detected by capacitance measurements above their respective maximum values. Thus the reports generated by the present invention, which specifically identify the nodes that have out-of-range capacitance measurements, and whether the node has a short circuit or an open circuit, will often greatly decrease the amount of time required to find and repair the faults in the micro-chip-module.

In a third embodiment, the ratios of the capacitances associated with the I/O pins of the predefined chips 104 are known in advance, and are stored in a set of additional vectors in Data Storage area 214. For instance, the capacitance ratio vector for "chip 1" would be represented as: $\{R1_1, R1_2, R1_3, \ldots R1_i\}$ where the number of pins for chip 1 is L and each value $R1_i$ represents the capacitance of pin i relative to the capacitances of the other pins of that chip. If one of the pins is assigned a ratio value of 1.0, then all the other pin ratio values will represent those pins' capacitances as multiple of that one pin's capacitance.

Typically, the pin capacitances of a semiconductor chip will depend on the doping levels in the semiconductor device, and all the pin capacitances will tend to change proportionately with changes in doping levels. Thus, if the capacitance of even one pin of the chip is known, the capacitances of the other pins can be computed using the stored ratio values. Based on this model of pin capacitances, equation 2 can be rewritten as follows:

$$\begin{pmatrix} CL_1 \\ CL_2 \\ \cdot \\ \cdot \\ \cdot \\ CL_X \end{pmatrix} = \begin{pmatrix} CU_1 \\ CU_2 \\ \cdot \\ \cdot \\ \cdot \\ CU_X \end{pmatrix} + \begin{pmatrix} SR1_1 & SR2_1 & \ldots & SRJ_1 \\ SR1_2 & SR2_2 & \ldots & SRJ_2 \\ \cdot & \cdot & & \cdot \\ \cdot & \cdot & \cdot & \cdot \\ \cdot & \cdot & & \cdot \\ SR1_X & SR2_X & \ldots & SRJ_X \end{pmatrix} \begin{pmatrix} CC1 \\ CC2 \\ \cdot \\ \cdot \\ \cdot \\ CCJ \end{pmatrix} \quad \text{(Eq. 3)}$$

where

J is the number of chips loaded onto the micro-chip module;

CC1 to CCJ represent a single unknown capacitance value for each chip, such that the capacitance of pin "x" of chip "y" is defined as $CCy > <Ry_x$; and $SR1_i$ represents the sum of the ratio values of pins from chip 1 that are connected to node i, $SR2_i$ represents the sum of the ratio values of pins from chip 1 that are connected to node i, and so on.

The ratio sum values $SR1_i$ to $SRJ_i$ are known in advance based on the stored chip capacitance ratio vectors, and the pins that should be connected to each node of the micro-chip module.

Note that the number of unknown values CC1 to CCJ in equation 3, above, is much less than the number of unknown values in equation 2. Matrix equation 3 is solved using the technique known as singular value decomposition. An advantage of this embodiment is that the interconnects for the ground and power supply voltages are fully tested.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for ensuring interconnect integrity in a micro-chip-module, said micro-chip-module comprising:

at least one receptacle for receiving predefined integrated circuit chips, each predefined integrated circuit chip having a multiplicity of pins; and a multiplicity of interconnects, each interconnect comprising a distinct node, each interconnect being connected to ones of said multiplicity of pins when said micro-chip-module is loaded with said predefined integrated circuit chips;

said method comprising the steps of:

storing in a computer memory first maximum and minimum capacitance values for each node for when said micro-chip-module is not loaded with said predefined integrated circuit chips;

contacting with a probe apparatus each node while said micro-chip-module is not loaded with said predefined integrated circuit chips;

measuring with a capacitance measurement apparatus a first measured capacitance for each node contacted by said probe apparatus while said micro-chip-module is not loaded with said predefined integrated circuit chips;

comparing for each node said first measured capacitance with the corresponding stored first maximum and minimum capacitance values;

generating a first signal indicating an interconnect error at each node for which said first measured capacitance does not fall within a range between said corresponding stored first maximum and minimum capacitance values;

storing in said computer memory second maximum and minimum capacitance values for each node for when said micro-chip-module is loaded with integrated circuit chips;

loading said predefined integrated circuit chips in said at least one receptacle;

contacting with said probe apparatus each node while said micro-chip-module is loaded;

measuring with said capacitance measurement apparatus a second measured capacitance value for each node contacted by said probe apparatus while said micro-chip-module is loaded;

comparing for each node said second measured capacitance value with the corresponding stored second maximum and minimum capacitance values; and generating a second signal indicating an interconnect error at each node for which said second measured capacitance value does not fall within a range between said corresponding stored second maximum and minimum capacitance values.

2. A method for ensuring interconnect integrity in a micro-chip-module, said micro-chip-module comprising:

at least one receptacle for receiving predefined integrated circuit chips, each predefined integrated circuit chip having a multiplicity of pins, each pin of each predefined integrated circuit chip being classified as one of a predefined set of pin types; and a multiplicity of interconnects, each interconnect comprising a distinct node, each interconnect being connected to ones of said multiplicity of pins when said micro-chip-module is loaded with said predefined integrated circuit chips;

said method comprising the steps of:

storing in a computer memory first maximum and minimum capacitance values for each node for when said micro-chip-module is not loaded with said predefined integrated circuit chips;

contacting with a probe apparatus each node while said micro-chip-module is not loaded with said predefined integrated circuit chips;

measuring with a capacitance measurement apparatus a first measured capacitance for each node contacted by said probe apparatus while said micro-chip-module is not loaded with said predefined integrated circuit chips;

comparing for each node said first measured capacitance with the corresponding stored first maximum and minimum capacitance values;

generating a first signal indicating an interconnect error at each node for which said first measured capacitance does not fall within a range between said corresponding stored first maximum and minimum capacitance values;

contacting with a probe apparatus each node while said micro-chip-module is loaded;

measuring with a capacitance measurement apparatus a second measured capacitance value for each node contacted by said probe apparatus while said micro-chip-module is loaded;

storing in said memory said second measured capacitance value for each node;

entering into a predefined set of equations, said first and second measured capacitance values for each node, each equation defining the capacitance of a respective node when said micro-chip-module is loaded with said predefined integrated circuit chips as the sum of (A) the capacitance of said respective node when said micro-chip-module is not loaded with said predefined integrated circuit chips and (B) a weighted sum of capacitance values for each predefined pin type connected to said respective node, wherein said weighted sum is weighted in accordance with the number of pins of each type connected to said respective node;

solving said predefined set of equations so as to generate computed capacitance values for each predefined pin type;

generating, in accordance with said computed capacitance values, second maximum and minimum capacitance values for each node for when said micro-chip-module is not loaded with said predefined integrated circuit chips;

comparing for each node said second measured capacitance value with the corresponding second maximum and minimum capacitance values; and generating a second signal indicating an interconnect error at each node for which said second measured capacitance value does not fall within a range between said corresponding second maximum and minimum capacitance values.

3. A method for ensuring interconnect integrity in a micro-chip-module, said micro-chip-module comprising:

at least one receptacle for receiving predefined integrated circuit chips, each predefined integrated circuit chip having a multiplicity of pins; and a multiplicity of interconnects, each interconnect comprising a distinct node having a pad, each interconnect also being connected to at least one of said multiplicity of pins when said micro-chip-module is loaded with said predefined integrated circuit chips;

said method comprising the steps of:

storing in a computer memory a corresponding pad position for each node;

storing in said computer memory first maximum and minimum capacitance values for each node for when said micro-chip-module is not loaded with said predefined integrated circuit chips;

contacting with a probe apparatus each node at said stored corresponding pad position while said micro-chip-module is not loaded with said predefined integrated circuit chips;

measuring with a capacitance measurement apparatus a first measured capacitance for each node contacted by said probe apparatus while said micro-chip-module is not loaded with said predefined integrated circuit chips;

comparing for each node said first measured capacitance with the corresponding stored first maximum and minimum capacitance values;

generating a first signal indicating an interconnect error at each node for which said first measured capacitance does not fall within a range between said corresponding stored first maximum and minimum capacitance values;

loading said predefined integrated circuit chips in said at least one receptacle;

contacting with said probe apparatus each node at said stored corresponding pad position while said micro-chip-module is loaded;

measuring with said capacitance measurement apparatus a second measured capacitance value for each node contacted by said probe apparatus while said micro-chip-module is loaded;

storing in said computer memory second maximum and minimum capacitance values for each node for when said micro-chip-module is loaded with said predefined integrated circuit chips;

comparing for each node said second measured capacitance value with the corresponding stored second maximum and minimum capacitance values; and generating a second signal indicating an interconnect error at each node for which said second measured capacitance value does not fall within a range between said corresponding stored second maximum and minimum capacitance values.

4. The method set forth in claim 3, wherein:

said first signal indicates that a short circuit exists at each node for which the first measured capacitance value is higher than the corresponding stored first maximum capacitance value;

said first signal indicates that an open circuit exists at each node for which the first measured capacitance value is lower than the corresponding stored first minimum capacitance value;

said second signal indicates that a short circuit exists at each node for which the second measured capacitance value is higher than the corresponding stored second maximum capacitance value; and said second signal indicates that an open circuit exists at each node for which the second measured capacitance value is lower than the corresponding stored second minimum capacitance value.

5. The method set forth in claim 3, further comprising the steps of:

storing in said computer memory a representation of said interconnects including data from which a total length for each interconnect can be derived;

generating said first minimum and maximum capacitance values for each node from said stored representation of said interconnects in accordance with said lengths of said interconnects;

storing in said computer memory a predefined capacitance value for each pin of each predefined integrated circuit chip;

entering into a predefined set of equations said first measured capacitance value for each node and said stored predefined capacitance value for each pin of each predefined integrated circuit chip, each equation defining for a respective node a capacitance value for when said micro-chip-module is loaded with said predefined integrated circuit chips as the sum of (A) a capacitance value for said respective node for when said micro-chip-module is unloaded and (B) a sum of capacitance values for the pins connected to said respective node; and solving said predefined set of equations so as to generate a computed capacitance value for each node for when said micro-chip-module is loaded with said predefined circuit chips; and generating said second maximum and minimum capacitance values for each node in accordance with said computed capacitance values for each node.

6. A method as recited in claim 3, wherein each pin of each predefined integrated circuit chip is classified as one of a predefined set of pin types, said method further comprising the steps of:

storing in said memory said second measured capacitance value for each node;

entering into a predefined set of equations said first and second measured capacitance values for each node, each equation defining the capacitance of a respective node when said micro-chip-module is loaded with said predefined integrated circuit chips as the sum of (A) the capacitance of said respective node when said micro-chip-module is not loaded with said predefined integrated circuit chips and (B) a weighted sum of capacitance values for each predefined pin type connected to said respective node, wherein said weighted sum is weighted in accordance with the number of pins of each type connected to said respective node;

solving said predefined set of equations so as to generate computed capacitance values for each predefined pin type;

generating, in accordance with said computed capacitance values, said second maximum and minimum capacitance values.

7. A method for ensuring interconnect integrity in a micro-chip-module, said micro-chip-module comprising:

at least one receptacle for receiving predefined integrated circuit chips, each predefined integrated circuit chip having a multiplicity of pins, each pin of each predefined integrated circuit chip being classified as one of a predefined set of pin types; and a multiplicity of interconnects, each interconnect comprising a distinct node having a pad, each interconnect also being connected to at least one of said multiplicity of pins when said micro-chip-module is loaded with said predefined integrated circuit chips;

said method comprising the steps of:

storing in a computer memory a corresponding pad position for each node;

storing in said computer memory first maximum and minimum capacitance values for each node for when said micro-chip-module is not loaded with said predefined integrated circuit chips;

contacting with a probe apparatus each node at said stored corresponding pad position while said micro-chip-module is not loaded with said predefined integrated circuit chips;

measuring with a capacitance measurement apparatus a first measured capacitance for each node contacted by said probe apparatus while said micro-chip-module is not loaded with said predefined integrated circuit chips;

comparing for each node said first measured capacitance with the corresponding stored first maximum and minimum capacitance values;

generating a first signal indicating an innerconnect error at each node for which said first measured capacitance does not fall within a range between said corresponding stored first maximum and minimum capacitance values;

contacting with a probe apparatus each node at said stored corresponding pad position while said micro-chip-module is loaded;

measuring with a capacitance measurement apparatus a second measured capacitance value for each node contacted by said probe apparatus while said micro-chip-module is loaded;

storing in said memory said second measured capacitance value for each node;

entering into a predefined set of equations said first and second measured capacitance values for each node, each equation defining the capacitance of a respective node when said micro-chip-module is loaded with said predefined integrated circuit chips as the sum of (A) the capacitance of said respective node when said micro-chip-module is not loaded with said predefined integrated circuit chips and (B) a corresponding weighted sum of pin type capacitance values for said respective node, wherein said corresponding weighted sum is weighted in accordance with the number of pins of each type connected to said respective node;

solving said predefined set of equations so as to generate computed capacitance values for each predefined pin type;

comparing for each node said second measured capacitance value with a sum of said first measured capacitance value and said corresponding weighted sum of said computed capacitance values; and generating a second signal indicating an interconnect error at each node for which said second measured capacitance value does not fall within a specified tolerance of said sum of said first measured capacitance value and said corresponding weighted sum of said computed capacitance values.

8. A method as recited in claim 7, wherein said solving step uses singular value decomposition of said predefined set of equations to generate said computed capacitance values for each predefined pin type.

9. A method for ensuring interconnect integrity in a micro-chip-module, said micro-chip-module comprising:

at least on receptacle for receiving predefined integrated circuit chips, each predefined integrated circuit chip having a multiplicity of pins; and a multiplicity of interconnects, each interconnect comprising a distinct node having at least one pad, each interconnect also being connected to at least one of said multiplicity of pins when said micro-chip-module is loaded with said predefined integrated circuit chips;

said method comprising the steps of:

storing in a computer memory a corresponding pad position for each pad of each node;

storing in said computer memory first maximum and minimum capacitance values for each pad of each node for when said micro-chip-module is not loaded with said predefined integrated circuit chips;

contacting with a probe apparatus each pad of each node at said stored corresponding pad position while said micro-chip-module is not loaded with said predefined integrated circuit chips;

measuring with a capacitance measurement apparatus a first measured capacitance value for each pad of each node contacted by said probe apparatus while said micro-chip-module is not loaded with said predefined integrated circuit chips;

storing in said computer memory said first measured capacitance value for each pad;

comparing for each pad of each node said first measured capacitance value with the corresponding stored first maximum and minimum capacitance values; and generating a first signal indicating an interconnect error at each pad of each node for which said first measured capacitance value does not fall within a range between said corresponding stored first maximum and minimum capacitance values;

loading said predefined integrated circuit chips in said at least one receptacle;

contacting with a probe apparatus each pad of each node at said stored corresponding pad position while said micro-chip-module is loaded;

measuring with said capacitance measurement apparatus a second measured capacitance value for each pad of each node contacted by said probe apparatus while said micro-chip-module is loaded;

storing in said computer memory said second measured capacitance value for each pad of each node;

storing in said computer memory second maximum and minimum capacitance values for each pad of each node for when said micro-chip-module is loaded with integrated circuit chips;

comparing for each pad of each node said second measured capacitance value with the corresponding stored second maximum and minimum capacitance values; and generating a second signal indicating an interconnect error at each pad of each node for which said second measured capacitance value does not fall within a range between said corresponding stored second maximum and minimum capacitance values.

10. A method as recited in claim 9 wherein each pin of each predefined integrated circuit chip is classified as one of a predefined set of pin types, said method further comprising the steps of:

storing in said computer memory a predefined capacitance value for each pin of each predefined integrated circuit chip;

entering into a predefined set of equations said first measured capacitance value for each pad of each node and said stored predefined capacitance value for each pin of each predefined integrated circuit chip, each equation defining for a respective pad of a respective node a capacitance value for when said micro-chip-module is loaded with said predefined integrated circuit chips as the sum of (A) a capacitance value for said respective pad for when said micro-chip-module is unloaded and (B) a sum of capacitance values for the pins connected to said respective pad; and solving said predefined set of equations so as to generate a computed capacitance value for each pad of each node for when said micro-chip-module is loaded with said predefined circuit chips; and generating said second maximum and minimum capacitance values for each pad of each node in accordance with said computed capacitance values for each pad of each node.

11. A method as recited in claim 9 wherein each pin of each predefined integrated circuit chip is classified as one of a predefined set of pin types, said method further comprising the steps of:

storing in said memory said second measured capacitance value for each pad of each node;

entering into a predefined set of equations said first and second measured capacitance values for each pad of each node, each equation defining the capacitance of a respective pad of a respective node when said micro-chip-module is loaded with said predefined integrated circuit chips as the sum of (A) the capacitance of said respective pad when said micro-chip-module is not loaded with said predefined integrated circuit chips and (B) a weighted sum of capacitance values for each predefined pin type connected to said respective pad, wherein said weighted sum is weighted in accordance with the number of pins of each type connected to said respective pad;

solving said predefined set of equations so as to generate computed capacitance values for each predefined pin type;

generating, in accordance with said computed capacitance values, said second maximum and minimum capacitance values.

12. An apparatus for testing interconnect integrity in a micro-chip-module, said micro-chip-module comprising:

at least one receptacle for receiving predefined integrated circuit chips, each predefined integrated circuit chip having a multiplicity of pins; and a multiplicity of interconnects, each interconnect comprising a distinct node, each interconnect being connected to ones of said multiplicity of pins when said micro-chip-module is loaded with said predefined integrated circuit chips;

said apparatus comprising:

a probe apparatus that contacts each node;

a capacitance measurement apparatus that measures a capacitance value for each node contacted by said probe apparatus; and testing means for determining whether an interconnect error exists at one of said nodes, said testing means including:

a computer memory storing first maximum and minimum capacitance values for each node for when said micro-chip-module is not loaded with said predefined integrated circuit chips and storing second maximum and minimum capacitance values for each node for when said micro-chip-module is loaded with said predefined integrated circuit chips;

control means for directing said probe apparatus to contact each node while said micro-chip-module is loaded and not loaded with said predefined integrated circuit chips; and receiving means for receiving from said capacitance measurement apparatus a first measured capacitance value for each node for when said micro-chip-module is not loaded and a second capacitance value for each node for when said micro-chip-module is loaded;

comparison means for comparing for each node said first measured capacitance value with the corresponding stored first maximum and minimum capacitance values and for each node said second measured capacitance value with said stored second maximum and minimum capacitance values; and signal generating means for generating a first signal indicating an interconnect error at each node for which said first measured capacitance value does not fall within a range between said corresponding stored first maximum and minimum capacitance values and a second signal indicating an interconnect error at each node for which said second measured capacitance value does not fall within a range between said corresponding stored second maximum and minimum capacitance values.

13. An apparatus as recited in claim 12 wherein:

each pin of each predefined integrated circuit chip is classified as one of a predefined set of pin types;

said computer memory includes means for storing a predefined capacitance value for each pin of each predefined integrated circuit chip;

said apparatus further comprises:

means for entering into a predefined set of equations said first measured capacitance value for each node and said stored predefined capacitance value for each pin of each predefined integrated circuit chip, each equation defining for a respective node a capacitance value for when said micro-chip-module is loaded with said predefined integrated circuit chips as the sum of (A) a capacitance value for said respective node for when said micro-chip-module is unloaded and (B) a sum of capacitance values for the pins connected to said respective pad; and means for solving said predefined set of equations so as to generate a computed capacitance value for each node for when said micro-chip-module is loaded with said predefined circuit chips; and means for generating said second maximum and minimum capacitance values for each node in accordance with said computed capacitance values for each node.

14. An apparatus for testing interconnect integrity in a micro-chip-module, said micro-chip-module comprising:

at least one receptacle for receiving predefined integrated circuit chips, each predefined integrated circuit chip having a multiplicity of pins; and a multiplicity of interconnects, each interconnect comprising a distinct node having at least one pad, each interconnect being connected to ones of said multiplicity of pins when said micro-chip-module is loaded with said predefined integrated circuit chips;

said apparatus comprising:

a probe apparatus that contacts each pad of each node;

a capacitance measurement apparatus that measures a capacitance value for each pad contacted by said probe apparatus; and testing means for determining whether an interconnect error exists at one of said nodes, said testing means including:

a computer memory storing a corresponding pad position for each pad of each node, and first maximum and minimum capacitance values for each pad of each node for when said micro-chip-module is not loaded with said predefined integrated circuit chips, and second maximum and minimum capacitance values for each node for when said micro-chip-module is loaded with said predefined integrated circuit chips;

control means for directing said probe apparatus to contact each pad at said stored corresponding pad position while said micro-chip-module is loaded and not loaded with said predefined integrated circuit chips; and receiving means for receiving from said capacitance measurement apparatus a first measured capacitance value for each pad of each node for when said micro-chip-module is not loaded and a second capacitance value for each pad of each node for when said micro-chip-module is loaded;

comparison means for comparing for each pad of each node said first measured capacitance value with the corresponding stored first maximum and minimum capacitance values and for each pad of each node said second measured capacitance value with said stored second maximum and minimum capacitance values; and signal generating means for generating a first signal indicating an interconnect error at each pad of each node for which said first measured capacitance value does not fall within a range between said corresponding stored first maximum and minimum capacitance values and a second signal indicating an interconnect error at each pad of each node for which said second measured capacitance value does not fall within a range between said corresponding stored second maximum and minimum capacitance values.

15. An apparatus as recited in claim 14 wherein:

each pin of each predefined integrated circuit chip is classified as one of a predefined set of pin types;

said memory includes means for storing said second measured capacitance value for each pad of each node;

said apparatus further comprises:

means for entering into a predefined set of equations said first and second measured capacitance values for each pad of each node, each equation defining the capacitance of a respective pad of a respective node when said micro-chip-module is loaded with said predefined integrated circuit chips as the sum of (A) the capacitance of said respective pad when said micro-chip-module is not loaded with said predefined integrated circuit chips and (B) a weighted sum of capacitance values for each predefined pin type connected to said respective pad, wherein said weighted sum is weighted in accordance with the number of pins of each type connected to said respective pad;

means for solving said predefined set of equations so as to generate computed capacitance values for each predefined pin type;

means for generating, in accordance with said computed capacitance values, said second maximum and minimum capacitance values.

* * * * *